United States Patent
Chen et al.

(10) Patent No.: US 7,420,422 B2
(45) Date of Patent: Sep. 2, 2008

(54) AUDIO AMPLIFIER DRIVEN BY SINGLE VOLTAGE SOURCE AND RELATED VOLTAGE SUPPLY CIRCUIT

(75) Inventors: Ming-Hsiung Chen, Taipei (TW); Shang-Shu Chung, Taipei (TW); Ming-Chung Li, Taipei (TW)

(73) Assignee: Princeton Technology Corporation, Hsin Tien, Taipei (TW)

( * ) Notice: Subject to any disclaimer, the term of this patent is extended or adjusted under 35 U.S.C. 154(b) by 29 days.

(21) Appl. No.: 11/621,970

(22) Filed: Jan. 10, 2007

(65) Prior Publication Data

US 2008/0116978 A1 May 22, 2008

(30) Foreign Application Priority Data

Nov. 21, 2006 (TW) .............................. 95220506 U

(51) Int. Cl.
*H03F 3/04* (2006.01)
(52) U.S. Cl. ...................... 330/297; 330/127

(58) Field of Classification Search ................. 330/127, 330/251, 285, 297; 381/120
See application file for complete search history.

(56) References Cited

U.S. PATENT DOCUMENTS 6,617,930 B2 * 9/2003 Nitta ........................... 330/297
7,298,214 B2 * 11/2007 Lee et al. ..................... 330/297

* cited by examiner

*Primary Examiner*—Khanh V Nguyen
(74) *Attorney, Agent, or Firm*—Winston Hsu

(57) ABSTRACT

After coupling a first voltage source to a voltage supply circuit, a second voltage source having a same electrical level but an opposite electrical pole with said first voltage source is generated. An audio amplifier is then driven by both the first voltage source and the second voltage source, where said audio amplifier requires a pair of voltage sources having the same electrical level but opposite electrical poles to be driven. The voltage supply circuit generates the second voltage source from the first voltage source by simultaneously switching two sets of switches, where said both sets of switches have non-synchronous statuses in switching.

10 Claims, 4 Drawing Sheets

AUDIO AMPLIFIER DRIVEN BY SINGLE VOLTAGE SOURCE AND RELATED VOLTAGE SUPPLY CIRCUIT

BACKGROUND OF THE INVENTION

1. Field of the Invention

The present invention relates to an audio amplifier and a related voltage supply circuit, and more particularly, to an audio amplifier driven by a single voltage source and a related voltage supply circuit.

2. Description of the Prior Art

Current audio amplifiers are popularly implemented with Class D amplifiers. A conventional Class AB amplifier generates linear signals whereas a Class D amplifier generates pulse width modulation (PWM) signals, which primarily includes audio signals, pulse width modulation signals, and harmonic waves. While a Class D amplifier operates, an output stage metal oxide semiconductor field-effect transistor (MOSFET) of said Class D amplifier is required to be biased with a pair of voltage sources, one of which is a positive voltage source whereas the other one is a negative voltage source, where said pair of voltage sources is mutually opposite in views of electrical pole and is equivalent in aspects of electrical level, for driving said Class D amplifier. In the prior art, the positive voltage source from the pair of voltage sources is coupled to a positive bias terminal of the output stage MOSFET of the Class D amplifier, whereas the negative voltage source from said pair of voltage sources is coupled to a negative bias terminal of the output stage MOSFET of said Class D amplifier, for biasing said Class D amplifier. That is, a port has to be further added on each of the positive bias terminal and the negative bias terminal of the output stage MOSFET of the Class D amplifier for receiving the positive voltage source and the negative voltage source respectively, and for driving the Class D amplifier.

SUMMARY OF THE INVENTION

The claimed invention provides an audio amplifier driven by single voltage source. The audio amplifier comprises a voltage supply circuit and an audio amplifier set. The voltage supply circuit comprises a first voltage source, a first switch having a first terminal coupled to the first voltage source, a second switch having a first terminal coupled to a second terminal of the first switch, and a second terminal coupled to ground, a first capacitor having a first terminal coupled to the second terminal of the first switch, and a second terminal, a third switch having a first terminal coupled to the second terminal of the first capacitor and a second terminal coupled to ground, a fourth switch having a first terminal coupled to the second terminal of the first capacitor and a second terminal, and a second capacitor having a first terminal coupled to the second terminal of the third switch and a second switch coupled to the second terminal of the fourth switch. The audio amplifier set comprises a plurality of sub-audio amplifiers, each of which having a positive voltage input terminal coupled to the first voltage source and a negative voltage input terminal coupled to the second terminal of the second capacitor.

The claimed invention also provides a voltage supply circuit. The voltage supply circuit comprises a first voltage source, a first switch, a second switch, a first capacitor, a third switch, a fourth switch, and a second capacitor. The first switch has a first terminal coupled to the first voltage source. The second switch has a first terminal coupled to a second terminal of the first switch, and a second terminal coupled to ground. The first capacitor has a first terminal coupled to the second terminal of the first switch, and a second terminal. The third switch has a first terminal coupled to the second terminal of the first capacitor, and a second terminal coupled to ground. The fourth switch has a first terminal coupled to the second terminal of the first capacitor, and a second terminal. The second capacitor has a first terminal coupled to the second terminal of the third switch, and a second terminal coupled to the second terminal of the fourth switch.

These and other objectives of the present invention will no doubt become obvious to those of ordinary skill in the art after reading the following detailed description of the preferred embodiment that is illustrated in the various figures and drawings.

DETAILED DESCRIPTION

The present invention provides an audio amplifier of biasing an output stage MOSFET with a pair of voltage sources having opposite electrical poles and a same electrical level, where said pair of voltage sources includes a positive voltage source and a negative voltage source and is generated from a single voltage source. Note that the audio amplifier of the present invention may be a Class D amplifier.

Figure 1:
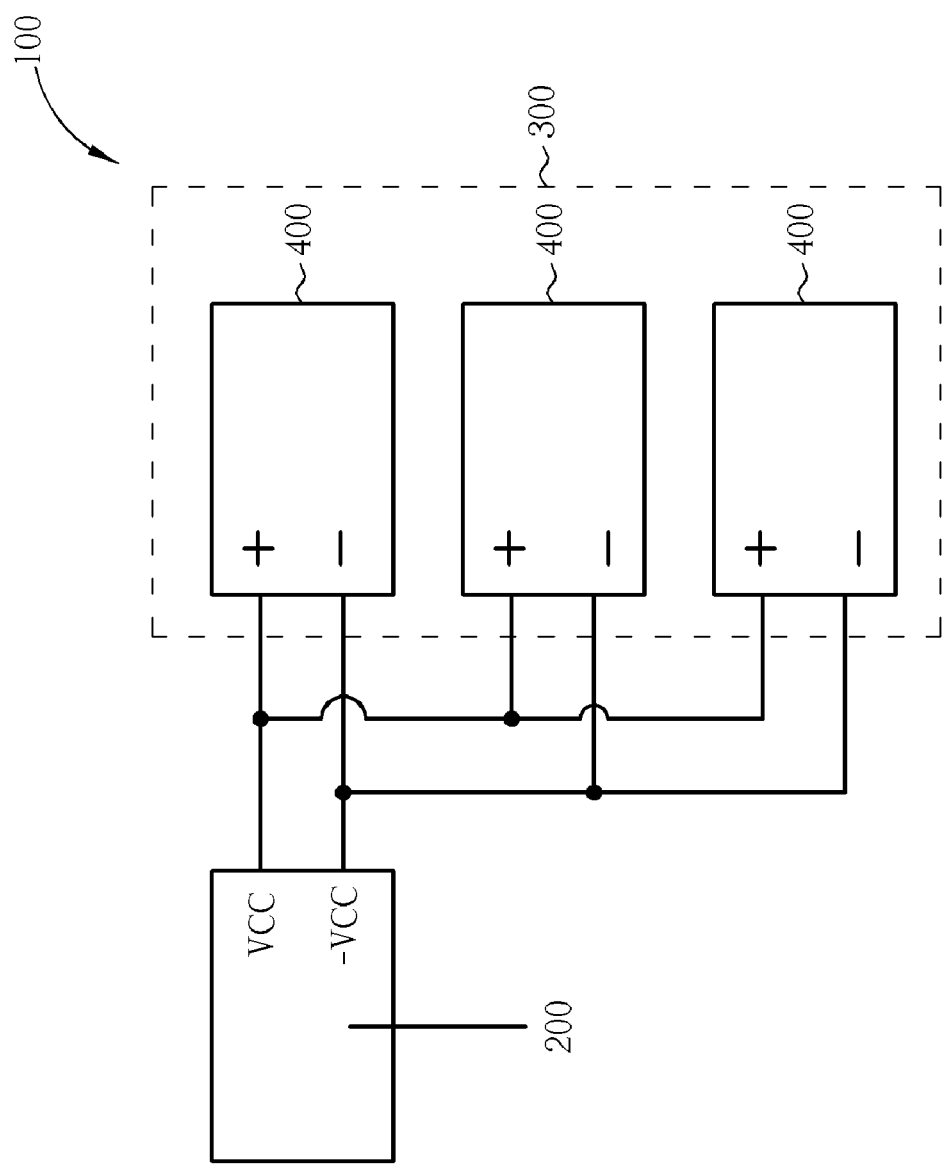
FIG. 1 is a block diagram of an audio amplifier of the present invention.

Please refer to FIG. 1, which is a block diagram of an audio amplifier 100 of the present invention. As shown in FIG. 1, the audio amplifier 100 includes a voltage supply circuit 200 and a sub-audio amplifier set 300. The sub-audio amplifier set 300 includes a plurality of sub-audio amplifiers 400. A positive voltage with an electrical level VCC is outputted from a positive output terminal of the voltage supply circuit 200 to each sub-audio amplifier 400 in the sub-audio amplifier set 300, whereas a negative voltage with an electrical level −VCC is also outputted from a negative output terminal of the voltage supply circuit 200 to each sub-audio amplifier 400 in the sub-audio amplifier set 300.

Figure 2:
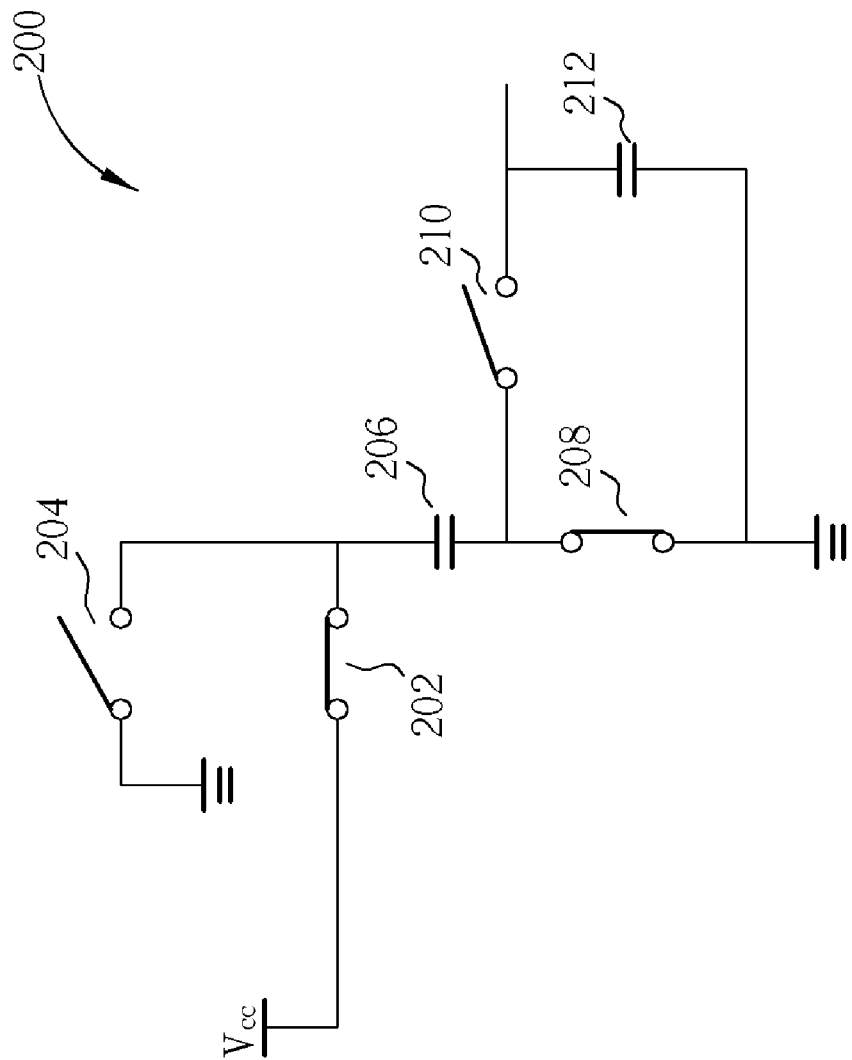
FIG. 2 is a diagram of the power supply circuit shown in FIG. 1, and illustrates a first stage of generating the second voltage source having the electrical level of −VCC.

Please refer to FIG. 2, which is a diagram of the power supply circuit 200 shown in FIG. 1. As shown in FIG. 2, the power supply circuit 200 includes a first voltage source VCC, a first switch 202, a second switch 204, a first capacitor 206, a third switch 208, a fourth switch 210, and a second capacitor 212. The first switch 202 has a first terminal coupled to the first voltage source VCC. The second switch 204 has a first terminal coupled to a second terminal of the first switch 202, and a second terminal coupled to ground. The first capacitor 206 has a first terminal coupled to the second terminal of the first switch 202. The third switch 208 has a first terminal coupled to a second terminal of the first capacitor 206, and a second terminal coupled to ground. The fourth switch 210 has a first terminal coupled to the second terminal of the first capacitor 206. The second capacitor 212 has a first terminal coupled to the second terminal of the third switch 208, and a second terminal coupled to a second terminal of the fourth switch 210.

Figure 3:
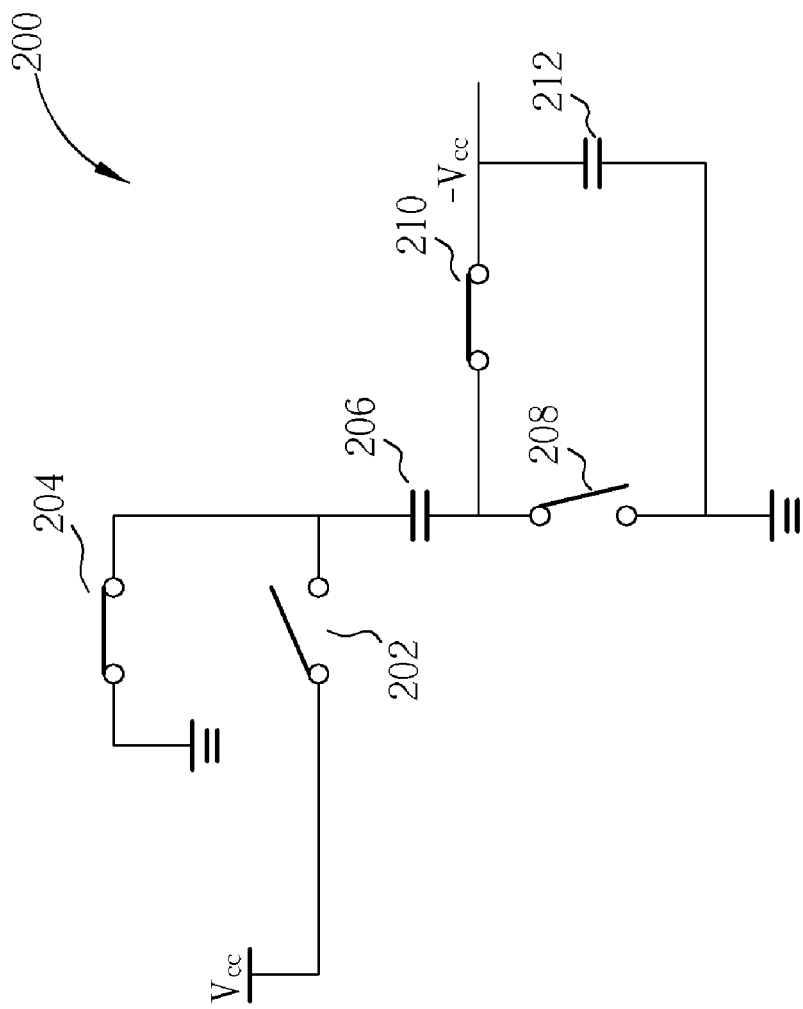
FIG. 3 illustrates a second stage of generating the second voltage source having the electrical level of −VCC according to the power supply circuit shown in FIG. 2.

The aim of the present invention is generating a second voltage source with an electrical level of –VCC at the first terminal of the second capacitor 212 by inputting the first voltage source with an electrical level of VCC to the voltage supply circuit 200, where the second voltage source with the electrical level of –VCC has the same electrical level but an opposite electrical pole with the first voltage source having the electrical level of VCC. Two stages are described in generating the second voltage source having the electrical level of –VCC. In a first stage, as illustrated in FIG. 2, both the first switch 202 and the third switch 208 are switched to be short-circuited, whereas both the second switch 204 and the fourth switch 210 are switched to be open-circuited. At this time, a voltage difference with an electrical level of VCC is generated across the first capacitor 206, where the electrical level at the first terminal of the first capacitor 206 is higher than the second terminal of the first capacitor 206. Please proceed to FIG. 3, which illustrates a second stage of generating the second voltage source having the electrical level of –VCC. As shown in FIG. 3, both the first switch 202 and the third switch 208 are switched to be open-circuited, whereas both the second switch 204 and the fourth switch 210 are switched to be short-circuited. At this time, the abovementioned voltage difference across the first capacitor 206 is maintained. Since both the first terminal of the first capacitor 206 and the first terminal of the second capacitor 212 are coupled to ground at the same time, therefore in the second stage, a voltage difference with the same electrical level with the voltage difference across the first capacitor 206 is generated across the second capacitor 212, and an electrical level at the second terminal of the second capacitor 212 thus becomes –VCC. At last, the second voltage source having the electrical level –VCC is thus generated as shown in FIG. 3.

With both the abovementioned first stage and second stage, the first voltage source having the electrical voltage VCC and the second voltage source having the electrical voltage –VCC are generated simultaneously in the power supply circuit 200 illustrated in both FIG. 2 and FIG. 3, for driving each sub-audio amplifier 400 in the sub-audio amplifier set 300 shown in FIG. 1.

Figure 4:
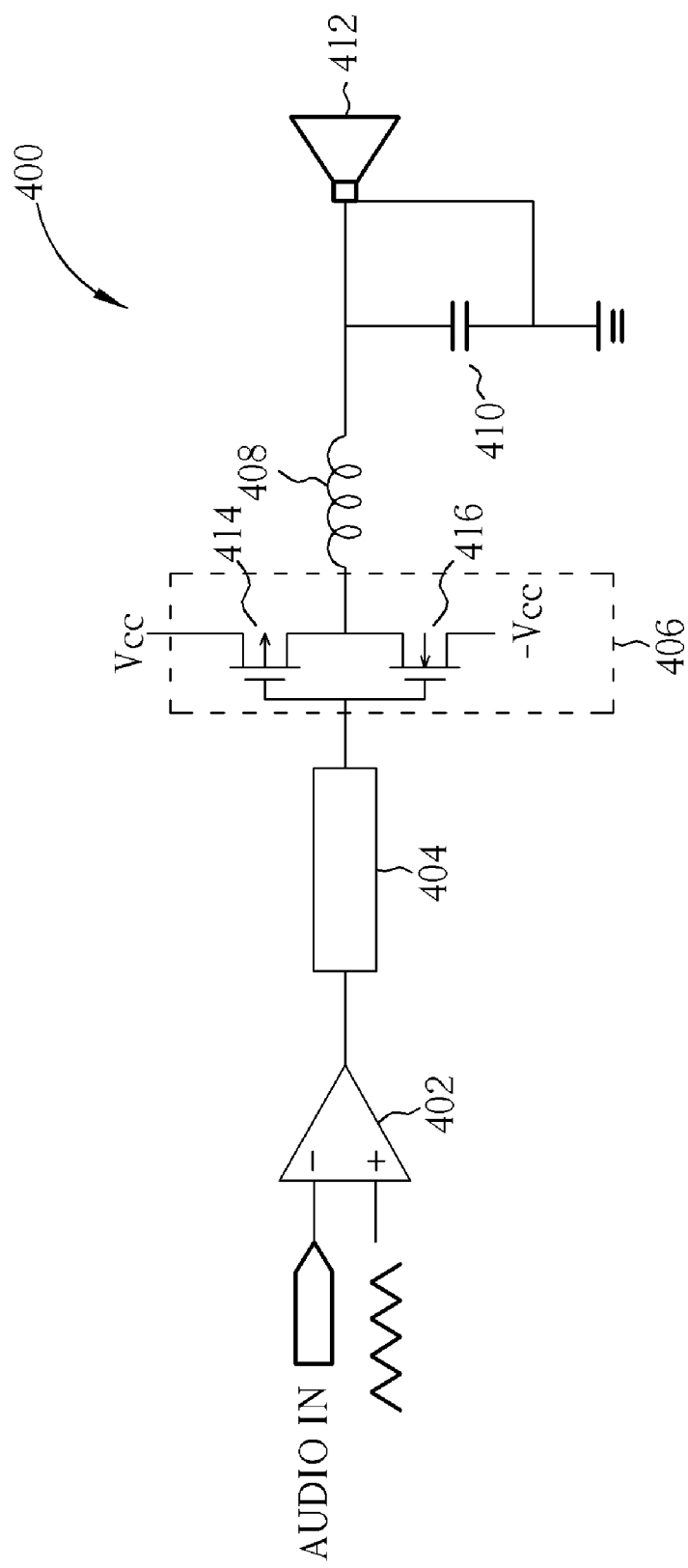
FIG. 4 is a diagram of the sub-audio amplifier shown in FIG. 1 according to a preferred embodiment of the present invention.

Please refer to FIG. 4, which is a diagram of the sub-audio amplifier 400 shown in FIG. 1 according to a preferred embodiment of the present invention. As shown in FIG. 4, the sub-audio amplifier 400 includes a comparator 402, a preceding driver 404, a transistor set 406, an inductor 408, a third capacitor 410, and a speaker 412. The comparator 402 has a positive input terminal coupled to a sawtooth signal source, and a negative input terminal coupled to an audio signal source AUDIO IN as shown in FIG. 4. With the aid of the sawtooth signal source, audio signals from the audio signal source AUDIO IN are transformed into pulse width modulation signals at an output terminal of the comparator 402. The preceding driver 404 has an input terminal coupled to the output terminal of the comparator 402, for receiving the pulse width modulation signals. The transistor set 406 has an input terminal coupled to an output terminal of the preceding driver 404, and includes a first transistor 414 and a second transistor 416. The first transistor 414 has a source coupled to the first voltage source having the electrical level of VCC, a gate coupled to the input terminal of the transistor set 406, and a drain coupled to an output terminal of the transistor set 406. The second transistor 416 has a drain coupled to the output terminal of the transistor set 406, a gate coupled to the input terminal of the transistor set 406, and a source coupled to the second terminal of the second capacitor 212 shown in FIG. 2, i.e., to the generated second voltage source having the electrical level of –VCC. The inductor 408 has a first terminal coupled to the output terminal of the transistor set 406. The third capacitor 410 has a first terminal coupled to a second terminal of the inductor 408, and a second terminal coupled to ground. The speaker 412 has a first input terminal coupled to the first terminal of the third capacitor 410, and a second input terminal coupled to the second terminal of the third capacitor 410. That is, the speaker 412 is parallel-coupled to the third capacitor 410, and therefore, the speaker 412 is driven by a voltage difference stored across the third capacitor 410.

Note that in the present invention, the sub-audio amplifier 400 shown in FIG. 1 is not necessarily implemented as illustrated in FIG. 4. It indicates a fact that the sub-audio amplifier 400 shown in FIG. 1 may also be replaced with other circuits required to be biased with a pair of voltage sources having a same electrical level but opposite electrical poles, and there are also embodiments of the present invention relating to the indicated fact. Besides, both the first transistor 414 and the second transistor 416 in the transistor set 406 may also be replaced by other elements capable of implementing an output stage in said transistor set 406, and such replacements should also be classified as embodiments of the present invention.

The present invention discloses an audio amplifier capable of biasing an output stage with single voltage source. In the disclosed audio amplifier, the single voltage source is coupled to a voltage supply circuit for generating another voltage source having a same electrical level but an opposite electrical pole with the coupled single voltage source, and for utilizing both the coupled voltage source and the generated voltage source to drive the disclosed audio amplifier. Note that the disclosed amplifier may be a Class D amplifier. With the aid of dispositions in the present invention, only one port is required to be added for biasing an output stage MOSFET of the disclosed audio amplifier instead of utilizing two ports for biasing an output stage MOSFET of an audio amplifier in the prior art. That is, an amount of ports utilized for biasing an output stage MOSFET of an audio amplifier is thus decreased or saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio amplifier driven by single voltage source comprising:
 a voltage supply circuit comprising:
  a first voltage source;
  a first switch having a first terminal coupled to the first voltage source;
  a second switch having a first terminal coupled to a second terminal of the first switch, and a second terminal coupled to ground;
  a first capacitor having a first terminal coupled to the second terminal of the first switch, and a second terminal;
  a third switch having a first terminal coupled to the second terminal of the first capacitor, and a second terminal coupled to ground;
  a fourth switch having a first terminal coupled to the second terminal of the first capacitor, and a second terminal; and
  a second capacitor having a first terminal coupled to the second terminal of the third switch, and a second terminal coupled to the second terminal of the fourth switch; and an audio amplifier set comprising:
  a plurality of sub-audio amplifiers, each of which having a positive voltage input terminal coupled to the first voltage source, and a negative voltage input terminal coupled to the second terminal of the second capacitor.

2. The audio amplifier of claim 1 wherein a switch status of the first switch is synchronous with a switch status of the third switch, a switch status of the second switch is synchronous with a switch status of the fourth switch, and the switch status of the first switch is not synchronous with the switch status of the second switch.

3. The audio amplifier of claim 1 wherein when both the first switch and the third switch are short-circuited, and both the second switch and the fourth switch are open-circuited, a second voltage source is generated from the first voltage source at the second terminal of the second capacitor, and an electrical pole of the second voltage source is opposite an electrical pole of the first voltage source.

4. The audio amplifier of claim 3 wherein after the second voltage source is generated, both the first switch and the third switch are switched to be open-circuited, and both the second switch and the fourth switch are switched to be short-circuited, for outputting a voltage of the second voltage source to the negative voltage input terminal of each of the plurality of sub-audio amplifiers.

5. The audio amplifier of claim 1 wherein each of the plurality of sub-audio amplifiers comprises:
  a comparator having a positive input terminal coupled to a signal source, and a negative input terminal coupled to an audio input source;
  a preceding driver having an input terminal coupled to an output terminal of the comparator;
  a transistor set having a first input terminal coupled to an output terminal of the preceding driver, and a second input terminal coupled to the output terminal of the preceding driver;
  an inductor having a first terminal coupled to the output terminal of the transistor set;
  a third capacitor having a first terminal coupled to the second terminal of the inductor, and a second terminal coupled to ground; and
  a speaker having a first input terminal coupled to the first terminal of the third capacitor, and a second input terminal coupled to the second terminal of the third capacitor, wherein the speaker is coupled to the third capacitor in a parallel manner.

6. The audio amplifier of claim 5 wherein a switch status of the first switch is synchronous with a switch status of the third switch, the switch status of the second switch is synchronous with a switch status of the fourth switch, and the switch status of the first switch is not synchronous with the switch status of the second switch.

7. The audio amplifier of claim 5 wherein when both the first switch and the third switch are short-circuited, and both the second switch and the fourth switch are open-circuited, a second voltage source is generated from the first voltage source at the second terminal of the second capacitor, and an electrical pole of the second voltage source is opposite an electrical pole of the first voltage source.

8. The audio amplifier of claim 7 wherein after the second voltage source is generated, both the first switch and the third switch are switched to be open-circuited, and both the second switch and the fourth switch are switched to be short-circuited, for outputting a voltage of the second voltage source to the negative voltage input terminal of each of the plurality of sub-audio amplifiers.

9. The audio amplifier of claim 8 wherein the transistor set comprises:
  a first transistor having a gate coupled to the first input terminal of the transistor set, a source coupled to the first voltage source, and a drain coupled to the output terminal of the transistor set; and
  a second transistor having a gate coupled to the second input terminal of the transistor set, a source coupled to the second voltage source, and a drain coupled to the output terminal of the transistor set.

10. The audio amplifier of claim 5 wherein the signal source is a sawtooth signal source.

* * * * *